(12) United States Patent
Shim et al.

(10) Patent No.: US 12,044,866 B2
(45) Date of Patent: Jul. 23, 2024

(54) WINDOW MEMBER, ELECTRONIC APPARATUS INCLUDING THE SAME, AND MANUFACTURING METHOD OF WINDOW MEMBER

(71) Applicant: Samsung Display Co., Ltd., Yongin-si (KR)

(72) Inventors: ByoungYul Shim, Hwaseong-si (KR); Beomgyu Choi, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 18/114,236

(22) Filed: Feb. 25, 2023

(65) Prior Publication Data
US 2023/0213689 A1    Jul. 6, 2023

Related U.S. Application Data

(63) Continuation of application No. 15/930,310, filed on May 12, 2020, now Pat. No. 11,592,600.

(30) Foreign Application Priority Data

Jul. 22, 2019    (KR) .................... 10-2019-0088412

(51) Int. Cl.
*H10K 59/60*    (2023.01)
*G02B 5/00*    (2006.01)
(Continued)

(52) U.S. Cl.
CPC .......... *G02B 5/003* (2013.01); *H04M 1/0266* (2013.01); *H04N 7/144* (2013.01); *H10K 59/126* (2023.02);
(Continued)

(58) Field of Classification Search
CPC ....... G02B 5/003; G02B 5/20; H04M 1/0266; H04M 2250/12; H04N 7/144;
(Continued)

(56) References Cited

U.S. PATENT DOCUMENTS 5,824,374 A    10/1998   Bradley, Jr. et al.
9,640,681 B2 *  5/2017   Min ..................... G02B 5/005
(Continued)

FOREIGN PATENT DOCUMENTS

EP    3255486 A1    12/2017
JP    2018116285 A    7/2018
(Continued)

OTHER PUBLICATIONS

Non-Final Office Action issued Jul. 15, 2022, in U.S. Appl. No. 15/930,310.
(Continued)

*Primary Examiner* — Mihir K Rayan
(74) *Attorney, Agent, or Firm* — CANTOR COLBURN LLP

(57) ABSTRACT

A window member including a base substrate and a light shielding layer including a first light shielding pattern disposed in a first area of the base substrate and a second light shielding pattern disposed in a second area of the base substrate while being spaced apart from the first light shielding pattern and providing a signal transmission area at an inner side thereof. The second light shielding pattern includes an edge having a plurality of curved portions on a plane. This arrangement reduces an area of the light shielding pattern adjacent to the signal transmission area of the window member.

16 Claims, 14 Drawing Sheets

(51) Int. Cl.
- *G06F 3/041* (2006.01)
- *H04M 1/02* (2006.01)
- *H04N 7/14* (2006.01)
- *H10K 50/86* (2023.01)
- *H10K 59/126* (2023.01)
- *H10K 59/65* (2023.01)
- *H10K 59/80* (2023.01)

(52) U.S. Cl.
CPC ............. *H10K 59/60* (2023.02); *H10K 59/65* (2023.02); *G06F 3/0412* (2013.01); *H10K 50/865* (2023.02); *H10K 59/87* (2023.02); *H10K 59/8792* (2023.02)

(58) Field of Classification Search
CPC .... H10K 59/126; H10K 59/60; H10K 50/865; H10K 59/87; H10K 77/111; H10K 2102/311; H10K 59/40; H10K 59/65; H10K 59/12; G06F 3/0412
See application file for complete search history.

(56) References Cited

U.S. PATENT DOCUMENTS

| | | |
|---|---|---|
| 9,759,847 B2 | 9/2017 | Matsuo et al. |
| 10,134,922 B2 | 11/2018 | Min |
| 10,466,822 B2 | 11/2019 | Kim et al. |
| 10,491,726 B2 | 11/2019 | Lee |
| 10,607,573 B2 * | 3/2020 | Silvanto ................ G06F 1/1605 |
| 10,792,886 B2 * | 10/2020 | Cheon ..................... B32B 27/40 |
| 11,057,556 B2 * | 7/2021 | Chen ................ G02F 1/133528 |
| 11,653,534 B2 * | 5/2023 | Koh ........................ H10K 59/12 |
| | | 257/88 |
| 2015/0271371 A1 | 9/2015 | Vogel et al. |
| 2016/0329518 A1 | 11/2016 | Xiao |
| 2017/0186891 A1 | 6/2017 | Min |
| 2018/0147810 A1 * | 5/2018 | Cheon ................ H04M 1/0283 |
| 2018/0188951 A1 * | 7/2018 | Kim ........................ G06F 3/016 |
| 2019/0043452 A1 * | 2/2019 | Silvanto ................ G06F 1/1686 |
| 2020/0006661 A1 | 1/2020 | Shinokawa et al. |
| 2020/0186688 A1 * | 6/2020 | Chen ...................... H04N 23/54 |
| 2020/0286688 A1 | 6/2020 | Chen et al. |
| 2022/0004050 A1 | 1/2022 | Yu |

FOREIGN PATENT DOCUMENTS

| | | |
|---|---|---|
| KR | 10-2013-0131017 | 12/2013 |
| KR | 10-1373142 | 3/2014 |
| KR | 10-2015-0091971 | 8/2015 |
| KR | 10-2018-0061532 | 6/2018 |
| KR | 10-2018-0063633 | 6/2018 |

OTHER PUBLICATIONS

Notice of Allowance issued Nov. 2, 2022, in U.S. Appl. No. 15/930,310.

* cited by examiner

WINDOW MEMBER, ELECTRONIC APPARATUS INCLUDING THE SAME, AND MANUFACTURING METHOD OF WINDOW MEMBER

CROSS-REFERENCE TO RELATED APPLICATIONS

This application is a Divisional of U.S. patent application Ser. No. 15/930,310, filed May 12, 2020, which claims priority from and the benefit of Korean Patent Application No. 10-2019-0088412, filed on Jul. 22, 2019, which is hereby incorporated by reference for all purposes as if fully set forth herein.

BACKGROUND

Field

Exemplary embodiments of the invention relate generally to a window member, an electronic apparatus including the same, and a manufacturing method of the window member and, more specifically, to a window member having a light shielding pattern with a reduced area adjacent to a signal transmission area, and an electronic apparatus including the same, and a manufacturing method of the window member.

Discussion of the Background

In recent years, a portable electronic apparatus has been widely provided, and a function and a design thereof have been further diversified. A user prefers an electronic apparatus having a display area having a wider area and a bezel area having a narrower area. Various shapes of electronic apparatuses have been developed to reduce the area of the bezel area. Various manufacturing methods for reducing the area of the bezel area have been suggested.

The above information disclosed in this Background section is only for understanding of the background of the inventive concepts, and, therefore, it may contain information that does not constitute prior art.

SUMMARY

Devices constructed according to exemplary embodiments of the invention are capable of providing a window member including a light shielding pattern having a narrow width, an electronic apparatus including the same, and a manufacturing method of the window member, which includes a process of manufacturing the light shielding pattern having the narrow width.

Additional features of the inventive concepts will be set forth in the description which follows, and in part will be apparent from the description, or may be learned by practice of the inventive concepts.

An exemplary embodiment of the inventive concepts provides a window member including: a base substrate; and a light shielding layer including a first light shielding pattern disposed in a first area of the base substrate and a second light shielding pattern disposed in a second area of the base substrate while being spaced apart from the first light shielding pattern and configured to provide a signal transmission area at an inner side thereof. Here, the second light shielding pattern includes an edge having a plurality of curved portions on a plane.

In an embodiment, the second light shielding pattern may have a multilayer structure.

In an embodiment, the second light shielding pattern may include a first layer disposed on the base substrate and a second layer disposed on the first layer, and a side surface of the first layer and a side surface of the second layer may be aligned on a cross-section.

In an embodiment, the edge may include an outer edge and an inner edge configured to define the signal transmission area, and the inner edge is a closed line.

In an embodiment, at least one of the outer edge and the inner edge may include the plurality of curved portions.

In an embodiment, a distance between the outer edge and the inner edge may be about 0.05 mm to about 1.50 mm.

In an embodiment, the signal transmission area may be provided in plurality.

In an embodiment, the base substrate may be a glass substrate, and the second light shielding pattern may be directly disposed on one surface of the glass substrate.

In an embodiment, the first light shielding pattern and the second light shielding pattern may have the same laminated structure.

In an embodiment, each of the curved portions may include a curved line recessed toward the inside of the second light shielding pattern on the plane.

In an embodiment, a pitch of the curved portions may be about 5 μm to about 30 μm.

In an embodiment, the second light shielding pattern may include a first layer having a black color and a second layer having a colored color.

In an exemplary embodiment of the inventive concepts, an electronic apparatus includes: a display panel including a display area configured to display an image and a non-display area disposed adjacent to the display area; a window member disposed on the display panel; and an input sensor disposed between the display panel and the window member. Here, the window member includes a base substrate and a light shielding pattern disposed on a bottom surface of the base substrate while being surrounded by the display area on a plane and configured to provide a signal transmission area at an inner side thereof, and the light shielding pattern includes an edge having a plurality of curved portions on the plane.

In an embodiment, the electronic apparatus may further include an electronic module disposed below the window member and the display panel and aligned with the signal transmission area.

In an embodiment, the electronic module may include a camera module, an infrared sensor, or a photo sensor.

In an embodiment, at least one of the display panel and the input sensor may include a first area corresponding to the signal transmission area and a second area adjacent to the first area, and the first area may have a light transmittance greater than the second area.

In an exemplary embodiment of the inventive concepts, a method for manufacturing a window member includes: providing a base substrate; and forming a light shielding layer including a first light shielding pattern on one surface of the base substrate and a is second light shielding pattern spaced apart from the first light shielding pattern and configured to define a signal transmission area at an inner side thereof. Here, the forming of the light shielding layer includes: forming a preliminary light shielding pattern corresponding to the second light shielding pattern on the one surface of the base substrate; and irradiating a partial area of the preliminary light shielding pattern with a laser beam.

In an embodiment, the preliminary light shielding pattern may define a preliminary signal transmission area at an inner side thereof, and in the irradiation of the laser beam, the laser beam may be irradiated to an outer edge area adjacent to an outer edge of the preliminary light shielding pattern and an inner edge area adjacent to an inner edge configured to define the preliminary signal transmission area.

In an embodiment, the irradiation of the laser beam may include: irradiating the inner edge area with a laser beam to form the signal transmission area; and irradiating the outer edge area adjacent to an outer edge of the preliminary light shielding pattern with a laser beam.

In an embodiment, the irradiation of the laser beam may include irradiating the laser beam from above a top surface of the base substrate.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate exemplary embodiments of the invention, and together with the description serve to is explain the inventive concepts.

DETAILED DESCRIPTION

Figure 1:
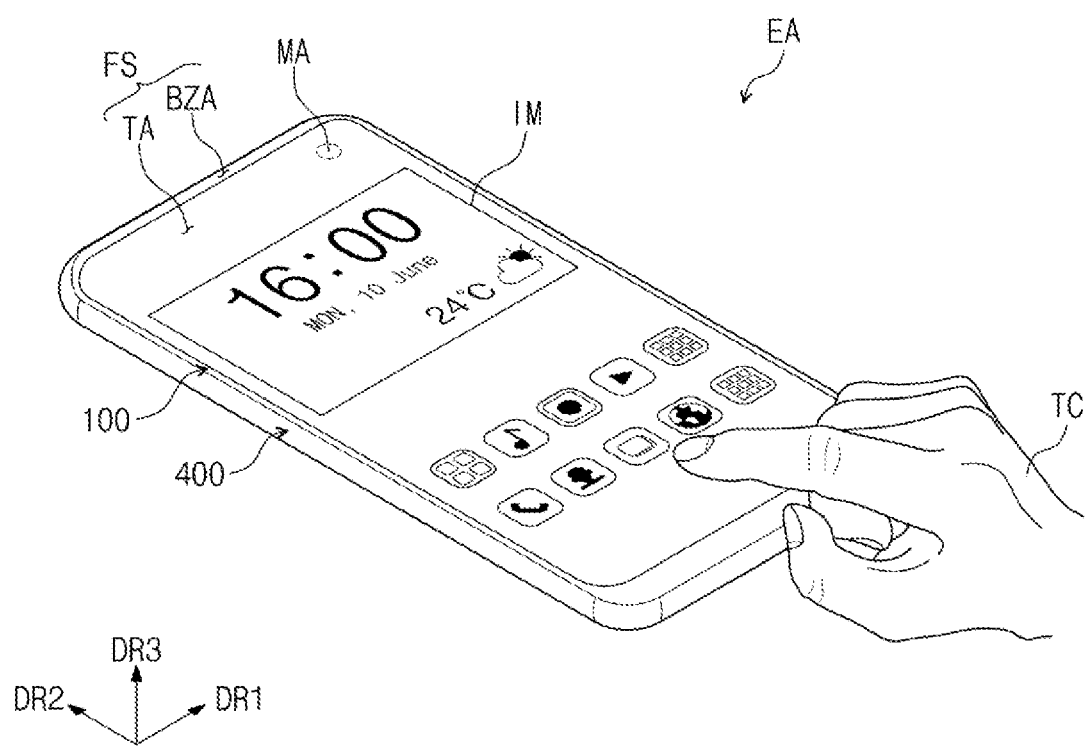
FIG. 1 is a perspective view illustrating an electronic apparatus according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described with reference to the accompanying drawings.

Figure 2:
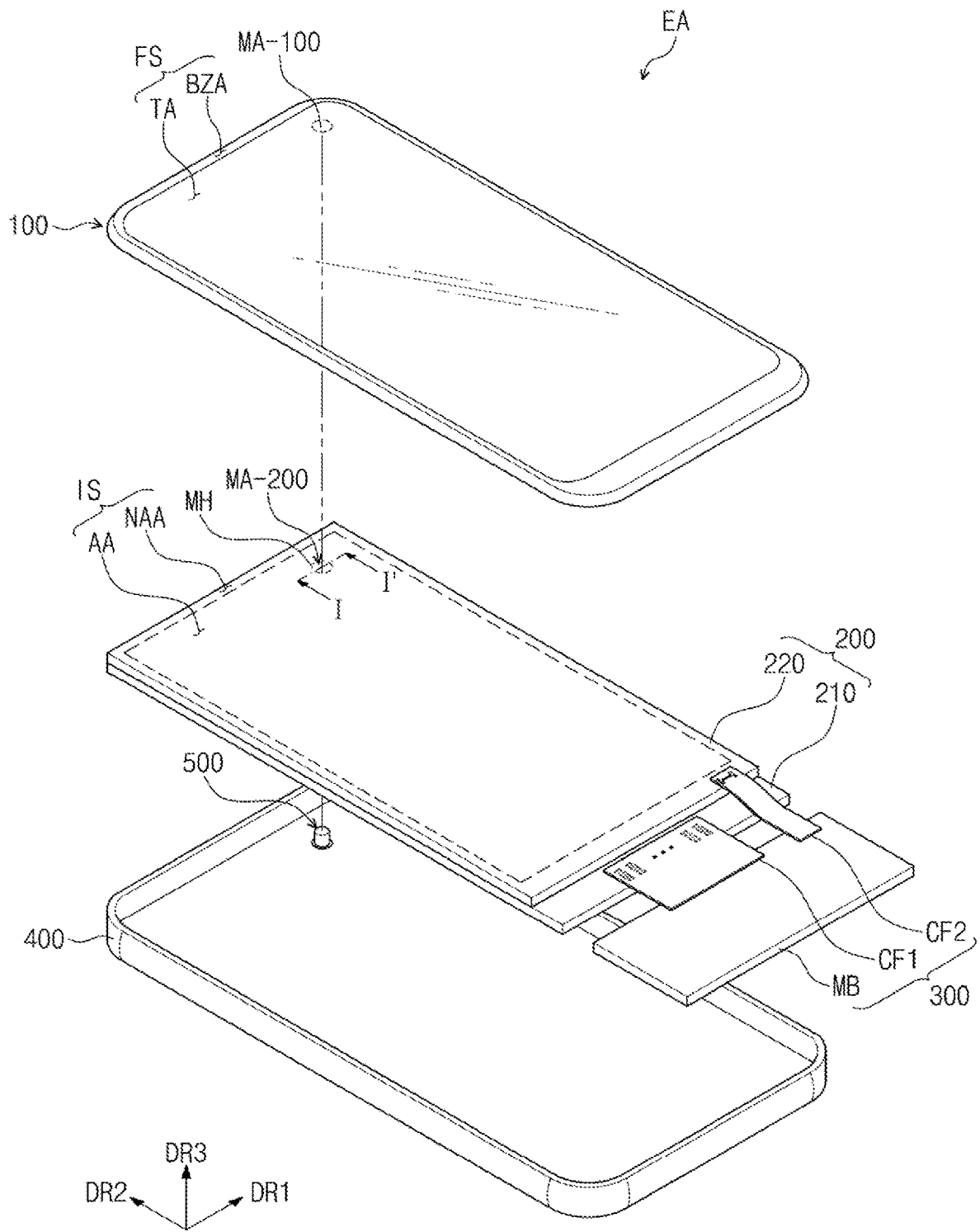
FIG. 2 is an exploded perspective view illustrating the electronic apparatus according to an exemplary embodiment of the inventive concepts.
Figure 3:
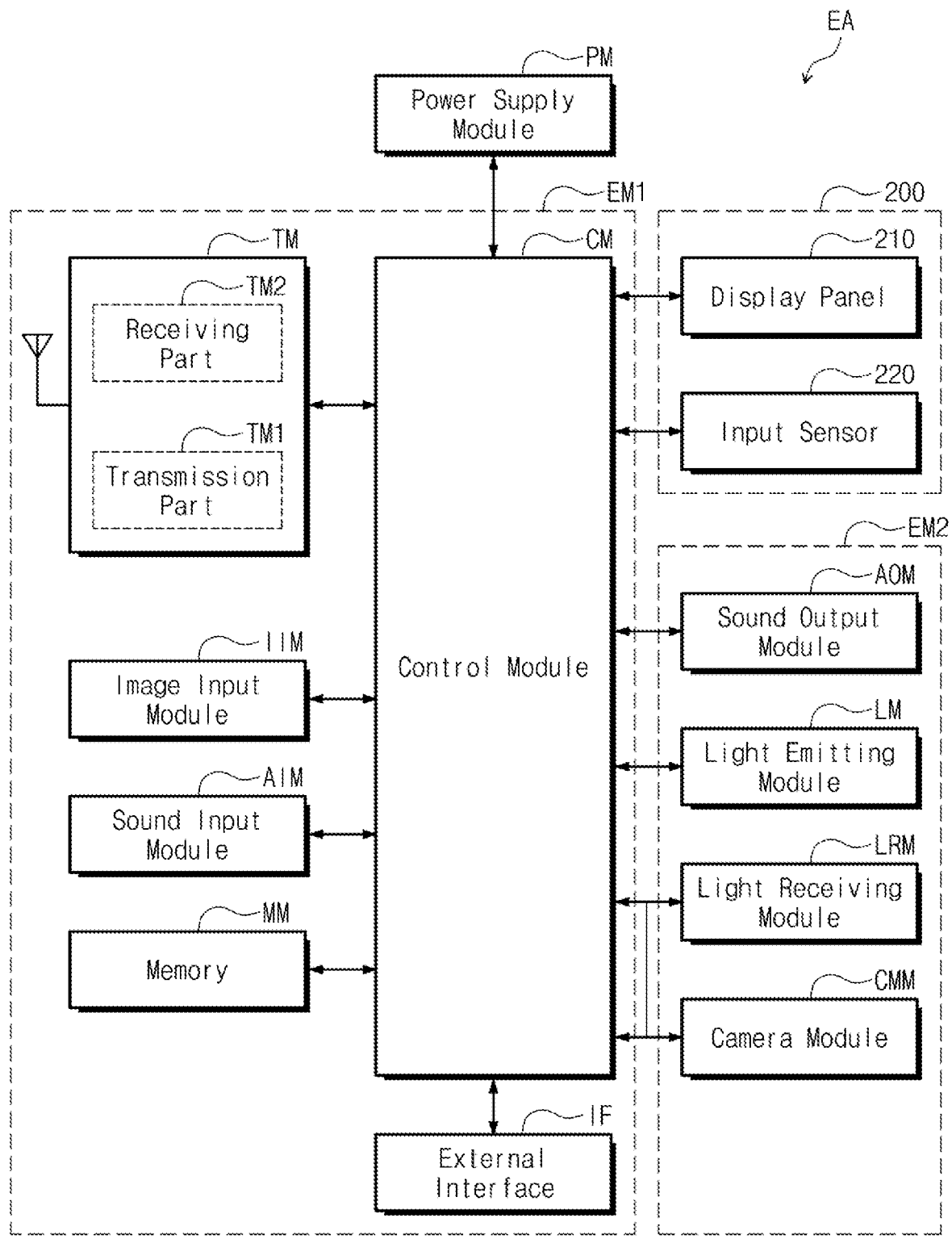
FIG. 3 is a block diagram representing the electronic apparatus according to an exemplary embodiment of the inventive concepts.

FIG. 1 is a perspective view illustrating an electronic apparatus according to an exemplary embodiment of the inventive concepts. FIG. 2 is an exploded perspective view illustrating the electronic apparatus according to an exemplary embodiment of the inventive concepts. FIG. 3 is a block diagram representing the electronic apparatus according to an exemplary embodiment of the inventive concepts.

Referring to FIGS. 1, 2, and 3, an electronic apparatus EA may be activated to display an image according to an electrical signal. The electronic apparatus EA may correspond to a tablet computer, a notebook computer, a personal computer, or a television. In this embodiment, a smartphone is exemplarily illustrated as the electronic apparatus EA.

The electronic apparatus EA may display an image IM on a display surface FS, which is parallel to each of a first direction DR1 and a second direction DR2, in a third direction DR3. The display surface FS on which the image IM is displayed may correspond to a front surface of the electronic apparatus EA and a front surface of a window member 100. Hereinafter, the display surface of the electronic apparatus EA, the front surface of the electronic apparatus EA, and the front surface of the window member 100 will be designated by the same reference numeral. The image IM may include a dynamic image as well as a static image. In FIG. 1, a clock window and application icons are illustrated as an example of the image IM.

In the embodiment, on the basis of a direction of displaying the image IM, a front surface (or top surface) and a rear surface (or bottom surface) of each of members are defined. The front surface and the rear surface may be opposing to each other in the third direction DR3, and normal directions of the front surface and the rear surface may be parallel to the third direction DR3. Also, directions indicated by the first to third directions DR1 to DR3, as relative concepts, may be converted with each other.

The electronic apparatus EA may include a window member 100, a display module 200, a driving circuit unit 300, a housing 400, and an electronic module 500. In the embodiment, the window member 100 and the housing 400 may be coupled to provide an outer shape of the electronic apparatus EA. The display module 200 includes a display panel 210 and an input sensor 220. The display panel 210 may include a display area for displaying an image IM and a non-display area disposed adjacent to the display area. The window member 100 may be disposed on the display panel 210, and the input sensor 220 may be disposed between the display panel 210 and the window member 100.

The window member 100 may contain an optically transparent insulating material. For example, the window member 100 may contain glass or plastic. The window member 100 may have a multilayer structure or a single layer structure. For example, the window member 100 may include a plurality of plastic films, which are coupled by an adhesive agent, or a glass substrate and a plastic film, which are coupled by an adhesive agent.

The window member 100 may be divided into a transmission area TA and a bezel area BZA on a plane. The transmission area TA may correspond to the display area, and the bezel area BZA may correspond to the non-display area. In this specification, an expression of "on a plane" may represent a case when viewed in the third direction DR3. Also, the "thickness direction" may represent the third direction DR3.

The transmission area TA may be an optically transparent area. The bezel area BZA may has a relatively lower light transmittance than that of the transmission area TA. The bezel area BZA defines a shape of the transmission area TA. The bezel area BZA may be disposed adjacent to the transmission area TA and surround the transmission area TA.

The bezel area BZA may have a predetermined color. The bezel area BZA may cover a non-active area NAA of the display module 200 to prevent the non-active area NAA from being viewed from the outside. However, embodiments of the inventive concepts are not limited thereto. For example, in the window member 100 according to another embodiment of the inventive concepts, the bezel area BZA may be omitted.

In an exemplary embodiment of the inventive concepts, a module area MA may overlap the electronic module 500 that will be described later. The electronic apparatus EA may receive an external signal necessary to the electronic module 500 through the module area MA or provide a signal outputted from the electronic module 500 to the outside. According to an embodiment of the inventive concepts, the module area MA may overlap the transmission area TA. Thus, the area of the transmission area TA may be reduced as many as an area for providing the module area MA in the transmission area TA.

Although one module area MA is exemplarily illustrated in FIG. 1, embodiments of the inventive concepts are not limited thereto. For example, two or more module areas MA may be provided. Also, although the module area MA is exemplarily defined at a right upper end of the transmission area TA in FIG. 1, embodiments of the inventive concepts are not limited thereto. For example, the module area MA may be defined in various areas such as a left upper end of the transmission area TA, a central portion of the transmission area TA, a left lower end of the transmission area TA, or a right lower end of the transmission area TA. As shown in FIG. 2, the module area MA may include a first module area MA-100 on the window member 100 and a second module area MA-200 on the display module 200.

As illustrated in FIG. 2, the display module 200 may be disposed below the window member 100. Here, the "below" may represent an opposite direction of a direction in which the display module 200 provides an image IM. The display module 200 may display the image IM and detect an external input TC. The display module 200 may include a front surface IS including an active area AA and a non-active area NAA. The active area AA may be activated according to an electrical signal.

In an embodiment, the active area AA may be an area in which the image IM is displayed and the external input TC is detected at the same time. The transmission area TA overlaps at least the active area AA. For example, the transmission area TA overlaps a whole of or at least a portion of the active area AA. Thus, a user may view the image IM through the transmission area TA or provide the external input TC (see FIG. 1).

The non-active area NAA may be an area covered by the bezel area BZA. The non-active area NAA may be disposed adjacent to the active area AA and surrounded by the active area AA. In the non-active area NAA, a driving circuit or a driving line for driving the active area AA may be disposed.

Although the display module 200 has a flat shape in the active area AA and the non-active area NAA in an embodiment, embodiments of the inventive concepts are not limited thereto. For example, the display module 200 may be partially bent in the non-active area NAA. Here, the display module 200 may be bent toward a rear surface of the electronic apparatus EA in the non-active area NAA, and thus an area of the bezel area BZA in the front surface of the electronic apparatus EA may be reduced. Alternatively, the display module 200 may be partially bent in the active area AA. In another embodiment, the non-active area NAA may be omitted from the display module 200.

The display module 200 may include a display panel 210 and an input sensor 220.

The display panel 210 may be a component that substantially generates the image IM. The image IM generated by the display panel 210 may be displayed on the front surface IS of the display module 200 and viewed to the user from the outside through the transmission area TA.

The input sensor 220 may detect the external input TC that is applied from the outside. For example, the input sensor 220 may detect the external input TC provided through the window member 100. Here, the external input TC may correspond to an input of the user. For example, the input of the user may include various types of external inputs such as a portion of a user's body, a pen, light, heat, or pressure. In an embodiment, the external input TC is illustrated by a touch operation using a user's hand applied through the display surface FS of the electronic apparatus EA. However, embodiments of the inventive concepts are not limited thereto. For example, the external input TC may be provided in various types. Also, the electronic apparatus EA may detect the external input TC applied to a side surface or a rear surface of the electronic apparatus EA according to a structure of the electronic apparatus EA.

The driving circuit unit 300 may be electrically connected to the display panel 210 and the input sensor 220. The driving circuit unit 300 may include a main circuit board MB, a first flexible film CF1, and a second flexible film CF2.

The first flexible film CF1 is electrically connected to the display panel 210. The first flexible film CF1 may connect the display panel 210 and the main circuit board MB. The first flexible film CF1 may be connected to pads (display pads) of the display panel 210, which are disposed in the non-active area NAA. The first flexible film CF1 provides an electrical signal for driving the display panel 210 to the display panel 210. The electrical signal may be generated from the first flexible film CF1 or the main circuit board MB.

The second flexible film CF2 is electrically connected to the input sensor 220. The second flexible film CF2 may connect the input sensor 220 and the main circuit board MB. The second flexible film CF2 may be connected to pads (detection pads) of the input sensor 220, which are disposed in the non-active area NAA. The second flexible film CF2 provides an electrical signal for driving the input sensor 220 to the input sensor 220. The electrical signal may be generated from the second flexible film CF2 or the main circuit board MB.

The main circuit board MB may include all sorts of driving circuits for driving the display module 200 or a connector for power supply. Each of the first flexible film CF1 and the second flexible film CF2 may be connected to the main circuit board MB. According to an embodiment of the inventive concepts, the display module 200 may be easily controlled through one main circuit board MB. However, embodiments of the inventive concepts are not limited thereto. For example, in the display module 200 according to an embodiment of the inventive concepts, the display panel 210 and the input sensor 220 may be connected to different main circuit boards to each other, and one of the first flexible film CF1 and the second flexible film CF2 may not be connected to the main circuit board MB.

In an embodiment, one area of the display module 200, which correspond to the module area MA, may have a relatively higher transmittance than the active area AA that does not overlap the module area MA. For example, at least a portion of each of components of the display panel 210 and components of the input sensor 220 may be removed. Thus, the electronic module 500 overlapping the module area MA may easily transmit and/or receive signals through the module area MA.

In FIG. 2, a predetermined hole MH (hereinafter, referred to as a module hole) is exemplarily defined in one area of the display module 200, which corresponds to the module area MA. The module hole MH may be defined in the active area AA and pass through the display module 200. The display panel 210 and the input sensor 220 may be penetrated by the module hole MH. That is, the module hole MH may be defined by removing all of components of the display panel 210 and components of the input sensor 220, which overlap the module area MA. As the module hole MH is defined in the active area AA, the module area MA may be provided in the transmission area TA.

On a plane, the electronic module 500 may overlap the module hole MH and the module area MA. The electronic module 500 may be disposed below the display module 200, and at least a portion of the electronic module 500 may be accommodated in the module hole MH. In more detail, the electronic module 500 may be disposed below the window member 100 and the display panel 210 and aligned to a signal transmission area STA (see FIG. 5A). The electronic module 500 may receive an external input TC transmitted through the module area MA or provide an output through the module area MA. The electronic module 500 may include a camera module, an infrared sensor, or a photo sensor.

The housing 400 is coupled with the window member 100. The housing 400 may be coupled with the window member 100 to provide an inner space. The display module 200 and the electronic module 500 may be accommodated in the inner space.

The housing 400 may contain a material having a relatively high rigidity. For example, the housing 400 may include a plurality of frames and/or plates, which are made of glass, plastic, or metal. The housing 400 may stably protect the components of the electronic apparatus EA accommodated in the inner space from an external impact.

Referring to FIG. 3, the electronic apparatus EA may include a display module 200, a power supply module PM, a first electronic module EM1, and a second electronic module EM2. The display module 200, the power supply module PM, the first electronic module EM1, and the second electronic module EM2 may be electrically connected to each other.

The power supply module PM provides a power necessary to an overall operation of the electronic apparatus EA. The power supply module PM may include a typical battery module.

Each of the first electronic module EM1 and the second electronic module EM2 may include various functional modules for operating the electronic apparatus EA.

The first electronic module EM1 may be directly mounted to a mother board, which is electrically connected to the display module 200, or a separated substrate, and then electrically connected to the mother board through a connector (not shown) or the like.

The first electronic module EM1 may include a control module CM, a wireless communication module TM, an image input module IIM, a sound input module AIM, a memory MM, and an external interface IF. Some of the above modules may be electrically connected to the mother board through a flexible circuit board instead of being mounted to the mother board.

The control module CM controls an overall operation of the electronic apparatus EA. The control module CM may be a microprocessor. For example, the control module CM may activate or inactivate the display module 200. The control module CM may control other modules such as the image input module IIM or the sound input module AIM on the basis of a touch signal received from the display module 200.

The wireless communication module TM may transceive a wireless signal with another terminal by using Bluetooth or WiFi link. The wireless communication module TM may use a general communication line to transceive a voice signal. The wireless communication module TM may include a transmission part TM1 that modulates a signal to be transmitted and transmits the modulated signal and a receiving part TM2 that demodulates a received signal.

The image input module IIM processes an image signal to convert the image signal into image data that is displayable on the display module 200. The sound input module AIM receives an external sound signal through a microphone in a recording mode or a voice recognition mode to convert the received sound signal into electrical voice data.

The external interface IF serves as an interface connected to an external charger, a wire/wireless data port, a card socket (e.g., a memory card and a SIM/UIM card), or the like.

The second electronic module EM2 may include a sound output module AOM, a light emitting module LM, a light receiving module LRM, and a camera module CMM. The above-described components may be directly mounted to the mother board, mounted to a separate substrate and electrically connected to the display module 200 through a connector (not shown) or the like, or electrically connected to the first electronic module EM1.

The sound output module AOM converts sound data received from the wireless communication module TM or sound data stored in the memory MM and outputs the converted sound data to the outside.

The light emitting module LM generates and outputs light. The light emitting module LM may output an infrared ray. The light emitting module LM may include a LED element. The light receiving module LRM may detect the infrared ray. The light receiving module LRM may be activated when an infrared ray above a predetermined level is detected. The light receiving module LRM may include a CMOS sensor. The infrared ray generated from the light emitting module LM may be outputted and then reflected by an external object (e.g. user's finger or face), and the reflected infrared ray may be incident into the light receiving module LRM. The camera module CMM may photograph an external image.

In an embodiment, the electronic module 500 may include at least one of the components of the first electronic module EM1 and the second electronic module EM2. For example, the electronic module 500 may include at least one of the sound output module AOM, the light emitting module LM, the light receiving module LRM, the camera module CMM, and a thermal detection module. In more detail, the electronic module 500 may detect an external subject received through the module area MA or provide a sound signal such as voice or light such as an infrared ray to the outside through the module area MA. Also, the electronic module 500 may include a plurality of modules. However, embodiments of the inventive concepts are not limited thereto.

Figure 4A:
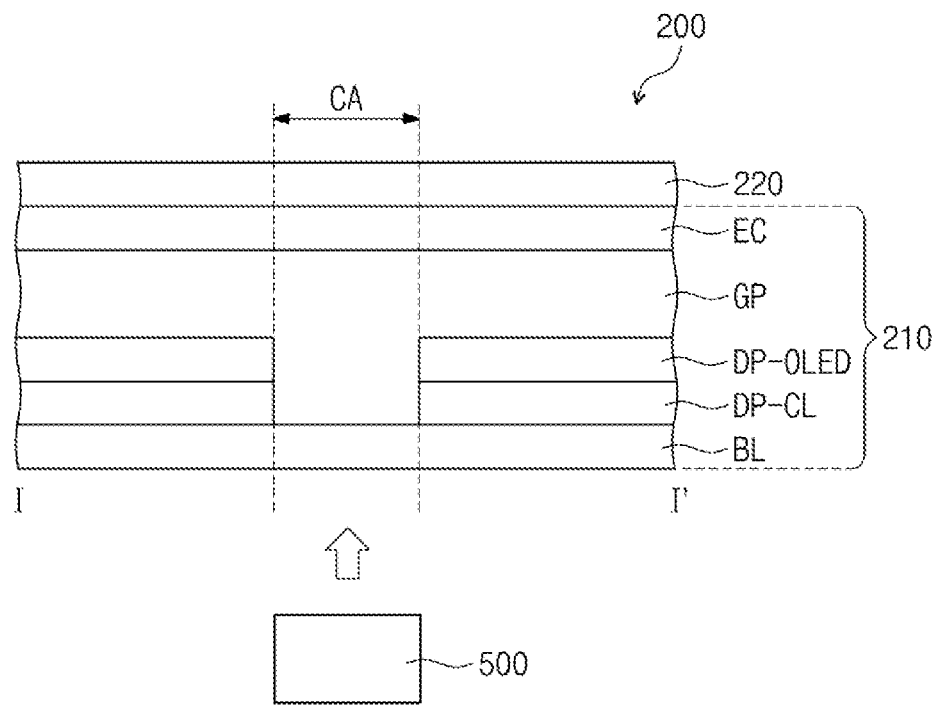
FIGS. 4A and 4B are cross-sectional views illustrating a portion of a display module according to an exemplary embodiment of the inventive concepts.
Figure 4B:
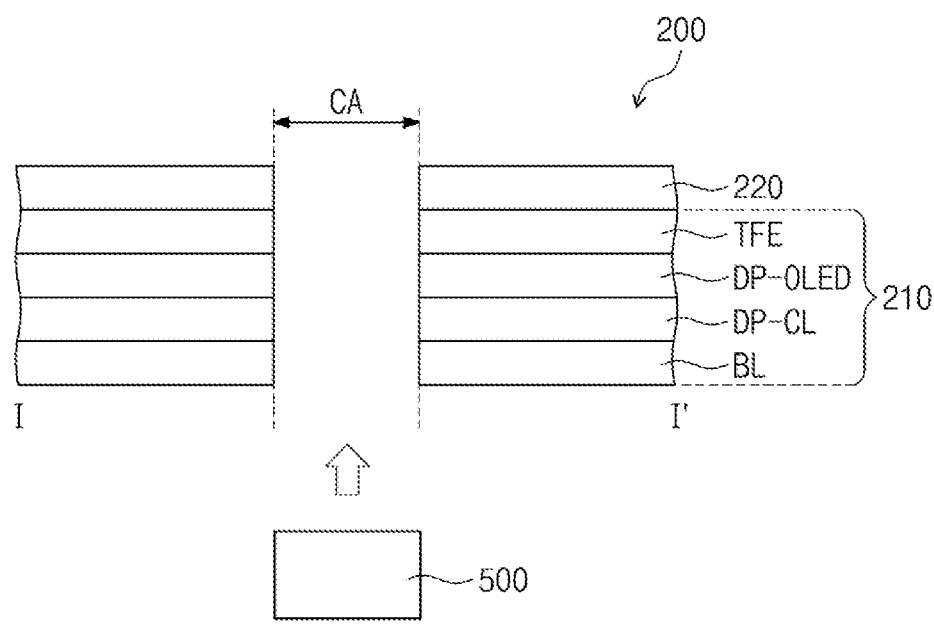

FIGS. 4A and 4B are cross-sectional views illustrating a portion of the display module 200 according to an exemplary embodiment of the inventive concepts. FIGS. 4A and 4B illustrate a cross-section taken along line I-I' of FIG. 2.

FIG. 4A is a cross-sectional view of the rigid-type display module 200 according to an exemplary embodiment of the inventive concepts, and FIG. 4B is a cross-sectional view of the flexible-type display module 200 according to an exemplary embodiment of the inventive concepts. In case of the flexible-type display module 200, a thin-film encapsulation layer TFE will be separate described, and the rest components will be described in conjunction with the rigid-type display module 200.

In FIG. 4A, the rigid-type display panel 210 includes a base layer BL, a circuit element layer DP-CL disposed on the base layer BL, a display element layer DP-OLED disposed on the circuit element layer DP-CL, and an encapsulation substrate EC.

The base layer BL may include a glass substrate. Besides, the base layer BL may include a substrate having a substantially constant refractive index in a visible ray range. The circuit element layer DP-CL includes at least one insulation layer and a circuit element. The circuit element layer DP-CL includes at least a transistor. Hereinafter, the insulation layer of the circuit element layer DP-CL includes at least one inorganic layer and/or at least one organic layer. The circuit element includes a signal line and a driving circuit of a pixel. The display element layer DP-OLED includes at least a light emitting element. The display element layer DP-OLED may include organic light emitting diodes as the light emitting element. The display element layer DP-OLED includes a pixel defining layer, e.g., an organic material. The encapsulation substrate EC may be a transparent substrate. The encapsulation substrate EC may include a glass substrate. Besides, the encapsulation substrate EC may include a substrate having a substantially constant refractive index in a visible ray range. A laminated structure from the base layer BL to the display element layer DP-OLED may be defined as a lower display substrate. A gap GP may be defined between the display element layer DP-OLED and the encapsulation substrate EC. Air or inert gases (hereinafter, referred to as an external gas) may be filled in the gap GP.

In FIG. 4B, the flexible-type display panel 210 includes a base layer BL, a circuit element layer DP-CL disposed on the base layer BL, a display element layer DP-OLED disposed on the circuit element layer DP-CL, and a thin-film encapsulation layer TFE.

The thin-film encapsulation layer TFE seals the display element layer DP-OLED. The thin-film encapsulation layer TFE includes at least one insulation layer. The thin-film encapsulation layer TFE according to an embodiment of the inventive concepts may include at least one inorganic layer (hereinafter, referred to as an encapsulation inorganic layer). Alternatively, the thin-film encapsulation layer TFE according to an embodiment of the inventive concepts may include at least one organic layer (hereinafter, referred to as an encapsulation organic layer) and at least one encapsulation inorganic layer. The encapsulation inorganic layer protects the display element layer DP-OLED from moisture/oxygen, and the encapsulation organic layer protects the display element layer DP-OLED from foreign substances such as dust particles. Although the encapsulation inorganic layer may include a silicon nitride layer, a silicon oxynitride layer, a silicon oxide layer, a titanium oxide layer, or an aluminum oxide layer, embodiments of the inventive concepts are not limited thereto. Although the encapsulation organic layer may include an acrylic-based organic layer, embodiments of the inventive concepts are not limited thereto.

The display panel 210 may include a central area CA corresponding to the module hole MH. The flexible-type display panel 210 has an opened central area CA unlike a closed central area CA of the rigid-type display panel 210.

An input sensor 220 may be disposed on the display panel 210. For example, the input sensor 220 may be directly disposed on the display panel 210 and coupled with the display panel 210 through an adhesive member. The display panel 210 may be provided, and then the input sensor 220 may be provided on the display panel 210 by a continuous process.

At least one of the display panel 210 and the input sensor 220 includes a first area corresponding to the signal transmission area STA (see FIG. 5A) and a second area disposed adjacent to the first area. Here, the first area has a greater light transmittance than the second area. The first area corresponds to the central area CA. The second area corresponds to the active area AA corresponding to the transmission area TA.

Figure 5A:
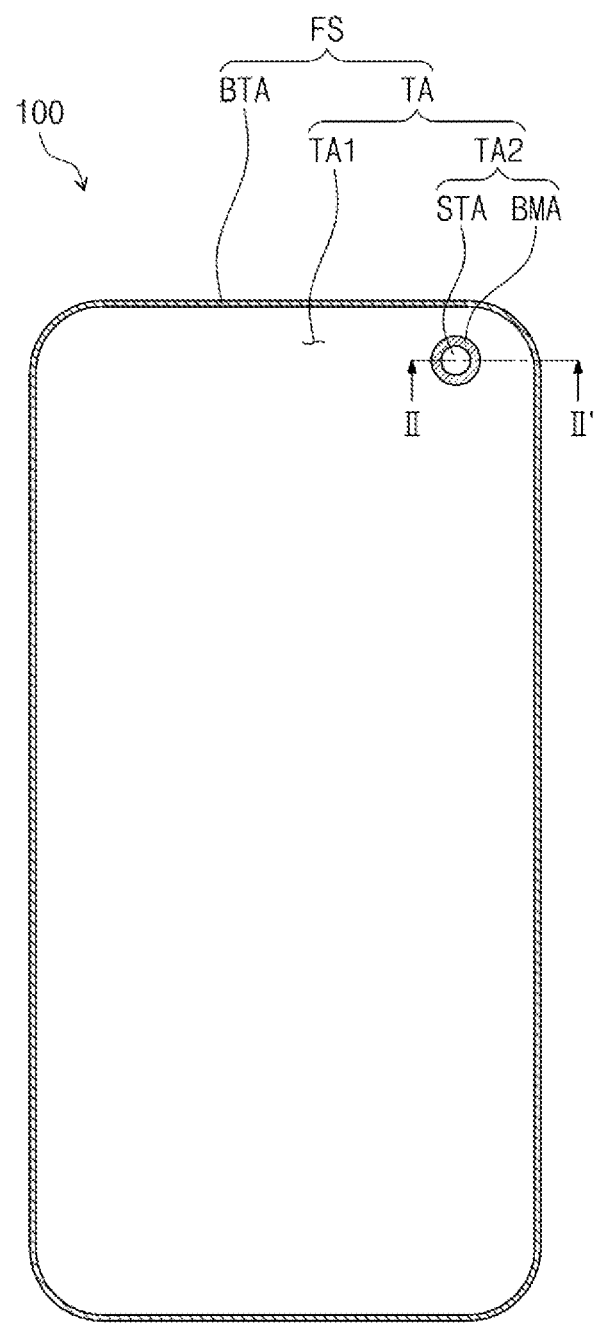
FIG. 5A is a plan view illustrating a window member according to an exemplary embodiment of the inventive concepts.
Figure 5B:
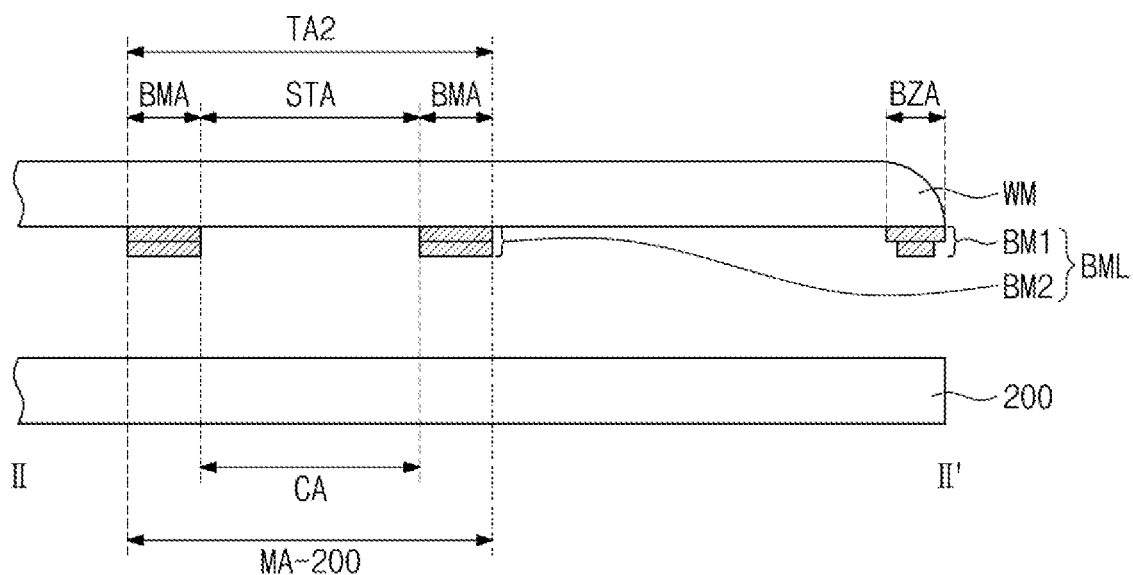
FIG. 5B is a cross-sectional view illustrating the window member according to an exemplary embodiment of the inventive concepts.
Figure 5C:
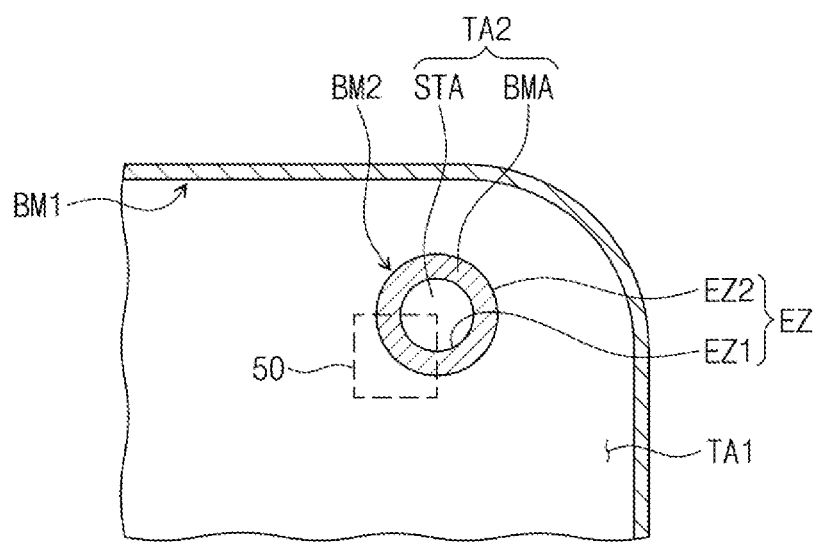
FIG. 5C is a partial plan view illustrating the window member according to an exemplary embodiment of the inventive concepts.
Figure 5D:
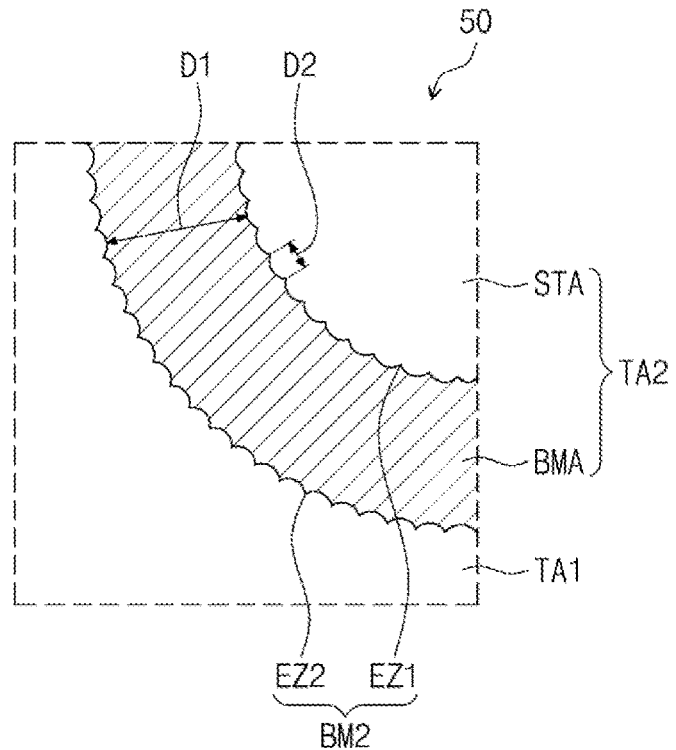
FIG. 5D is an enlarged plan view illustrating a second light shielding pattern of FIG. 5C.
Figure 5E:
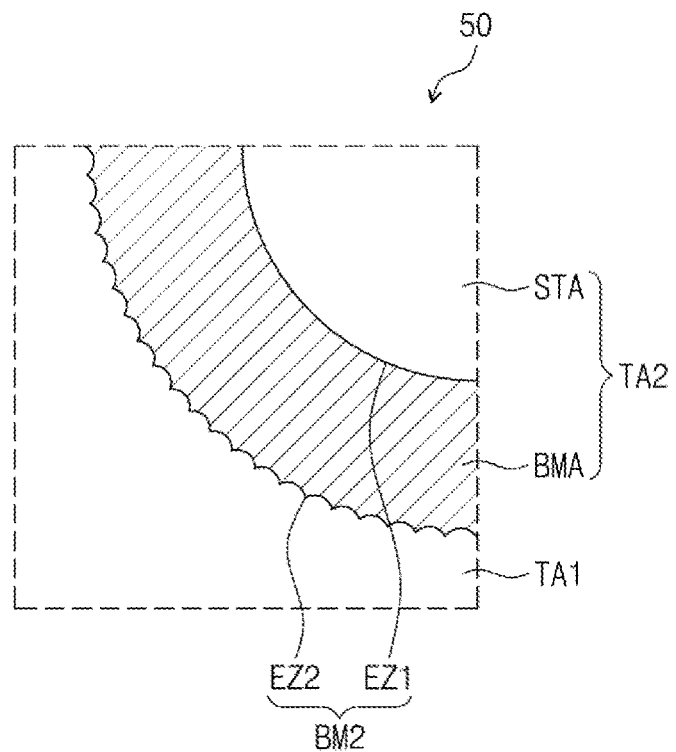
FIG. 5E is a plan view illustrating one embodiment of the second light shielding pattern of FIG. 5C.

FIG. 5A is a plan view illustrating a window member according to an exemplary embodiment of the inventive concepts. FIG. 5B is a cross-sectional view taken long line II-II' of FIG. 5A. FIG. 5C is a partial plan view illustrating the window member according to an exemplary embodiment of the inventive concepts. FIG. 5D is an enlarged plan view illustrating a second light shielding pattern of FIG. 5C. FIG. 5E is a plan view illustrating another embodiment of the second light shielding pattern of FIG. 5C.

Referring to FIGS. 5A and 5B, a window member 100 includes a base substrate WM and a light shielding layer BML. Although the base substrate WM may be a transparent substrate such as a glass substrate in an embodiment, embodiments of the inventive concepts are not limited thereto. For example, the base substrate WM may include plastic. The base substrate WM may include a first area and a second area. A display surface FS may correspond to the front surface of the electronic apparatus EA, and include a transmission area TA and a bezel area BZA in correspondence to a front surface of the window member 100.

In FIG. 5A, in the embodiment, the first area may correspond to the bezel area BZA, and the second area may correspond to the transmission area TA. The transmission area TA may include a first sub-area TA1 and a second sub-area TA2. The second sub-area TA2 corresponds to the first module area MA-100 in FIG. 2. The first sub-area TA1 may be an area in which a light shielding pattern (a first light shielding pattern and a second light shielding pattern) is not disposed and through which a light is transmitted, and the second sub-area TA2 may include a signal transmission area STA and a light shielding pattern area BMA that is a surrounding area adjacent to the signal transmission area STA.

In FIG. 5B, the light shielding layer BML may include a first light shielding pattern BM1 and a second light shielding pattern BM2. In more detail, the first light shielding pattern BM1 may be disposed in the bezel area BZA of the base substrate WM, and the second light shielding pattern BM2 may be spaced apart from the first light shielding pattern BM1 and disposed in the light shielding pattern area BMA of the transmission area TA.

In an embodiment, preferably, the second light shielding pattern BM2 may be directly disposed on one surface of the base substrate WM. The second light shielding pattern BM2 may be directly disposed on the base substrate WM through a deposition, printing, or coating process. In another embodiment, a film printed with the second light shielding pattern BM2 may be coupled to one surface of the base substrate WM by an adhesive layer. The second light shielding pattern BM2 may provide the signal transmission area STA at an inner side thereof and the signal transmission area STA may have a greater light transmittance than the transmission area TA. The signal transmission area STA may correspond to or be greater than the central area CA of the display panel 210 of the display module 200.

In an embodiment, the second light shielding pattern BM2 may have a multilayer structure. In more detail, the second light shielding pattern BM2 may include a first layer P1 disposed on the base substrate WM and a second layer P2 disposed on the first layer P1. One of the first layer P1 and the second layer P2 may have a black color, and the other may have a colored color. For example, the first layer P1 contacting the base substrate WM may have a black color, and the second layer P2 may have a colored color. However, embodiments of the inventive concepts are not limited to the multilayer structure including the first and second layers P1 and P2 of the second light shielding pattern BM2. For example, the second light shielding pattern BM2 may correspond to a laminated structure including three or more plurality of layers.

In an embodiment, a side surface of the first layer P1 and a side surface of the second layer P2 may be aligned on a cross-section. The first light shielding pattern BM1 and the second light shielding pattern BM2 may have the same laminated structure including multi-layers. Here, the first light shielding pattern BM1 may have a laminated structure in which side surfaces of layers are not aligned and a stepped portion exists between the layers unlike a laminated structure of the second light shielding pattern BM2.

Referring to FIG. 5C, the second sub-area TA2 may include the signal transmission area STA and the light shielding pattern area BMA. The second light shielding pattern BM2 may be disposed in the light shielding pattern area BMA, and the signal transmission area STA may be defined at an inner side of the second light shielding pattern BM2. The second light shielding pattern BM2 may include an edge EZ on a plane. The edge EZ may include an outer edge EZ2 and an inner edge EZ1 defining the signal transmission area STA. The inner edge EZ1 may provide a closed line. That is, the second light shielding pattern BM2 may be realized to have a circular ring shape surrounding the signal transmission area STA through the inner edge EZ1 and the outer edge EZ2.

FIG. 5D is an enlarged plan view illustrating a partial area 50 of the second light shielding pattern BM2 of FIG. 5C. Referring to FIG. 5D, at least one of the inner edge EZ1 and the outer edge EZ2 may include a plurality of curved portions. For example, all of the inner edge EZ1 and the outer edge EZ2 may include a plurality of curved portions. The plurality of curved portions may include a curved line recessed toward the inner side of the second light shielding pattern BM2. However, embodiments of the inventive concepts are not limited thereto. For example, the plurality of curved portions may be realized to have a winding shape according to various embodiments.

In an embodiment, a distance D1 between the outer edge EZ2 and the inner edge EZ1 may be about 0.05 mm to about 1.50 mm. The distance D1 between the outer edge EZ2 and the inner edge EZ1 may determine a width of the second light shielding pattern BM2. The width of the second light shielding pattern BM2 may determine a size of each of the signal transmission area STA and the transmission area TA. In an exemplary embodiment of the inventive concepts, the window member 100 may reduce a width of the second light shielding pattern BM2 and increase a size of each of the signal transmission area STA and the transmission area TA. According to the exemplary embodiment of the inventive concepts, as the width of the second light shielding pattern BM2 is reduced, a dimensional tolerance may be restricted from occurring, and a dead space having a reduced size may be provided around the signal transmission area STA. In an embodiment, a pitch D2 of the plurality of curved portions may be variably determined according to the kind of laser beam used in a manufacturing method. For example, a size of the pitch D2 may be about 5 μm to about 50 μm.

Referring to FIG. 5E, only the outer edge EZ2 may include a plurality of curved portions except the inner edge EZ1. In this case, the size of the signal transmission area STA may not be changed, and the width of the second light shielding pattern BM2 may be reduced. Also, only the inner edge EZ1 may include a plurality of curved portions except the outer edge EZ2. In this case, as the width of the second light shielding pattern BM2 is reduced, the size of the signal transmission area STA may increase.

Figure 6A:
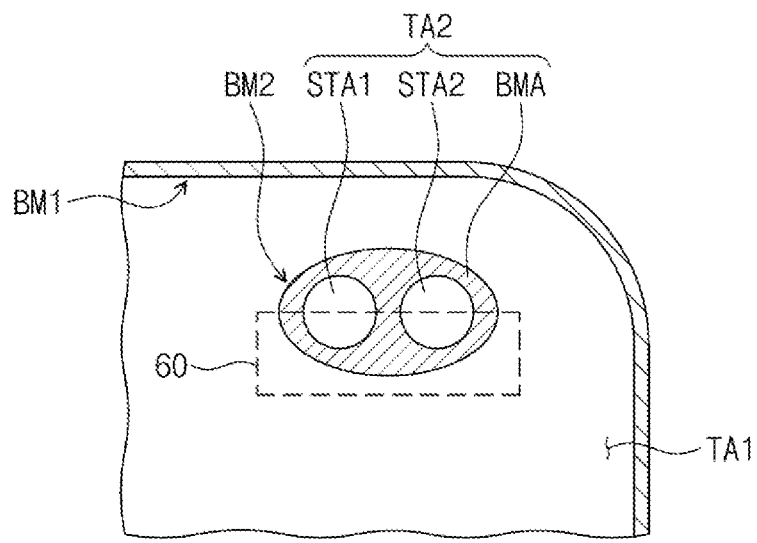
FIG. 6A is a partial plan view illustrating a window member according to an exemplary embodiment of the inventive concepts.
Figure 6B:
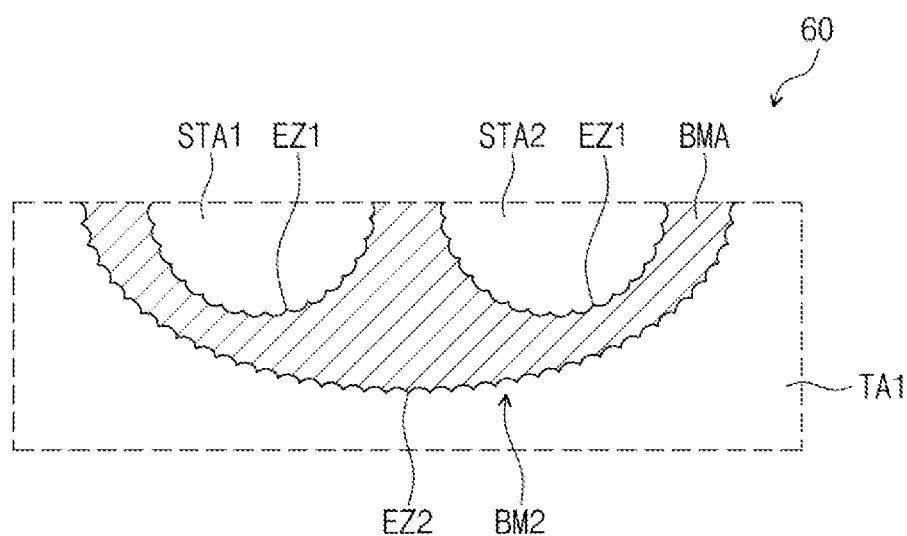
FIG. 6B is an enlarged plan view illustrating a second light shielding pattern of FIG. 6A.

FIG. 6A is a partial plan view illustrating a window member according to an exemplary embodiment of the inventive concepts. FIG. 6B is an enlarged plan view illustrating a partial area 60 of the second light shielding pattern BM2 in FIG. 6A.

In an embodiment, the signal transmission area STA may be provided in plurality. In FIG. 6A, the second light shielding pattern BM2 including a first signal transmission area STA1 and a second signal transmission area STA2 is exemplarily illustrated. Although the first signal transmission area STA1 and the second signal transmission area STA2 are illustrated to have same sizes and shapes in FIG. 6A, in other embodiments, the first signal transmission area STA1 and the second signal transmission area STA2 may have different sizes and shapes from each other. For example, the first signal transmission area STA1 may have a size less than that of the second signal transmission area STA2 and have a rectangular or oval shape. At least one of a plurality of inner edges EZ1 and an outer edge EZ2 may include a plurality of curved portions. Although all of inner edges EZ1 and an outer edge EZ2 include a plurality of curved portions in FIG. 6B, embodiments of the inventive concepts are not limited thereto. For example, only one of the inner edge EZ1 or the outer edge EZ2 may include a plurality of curved portions.

Figure 7A:
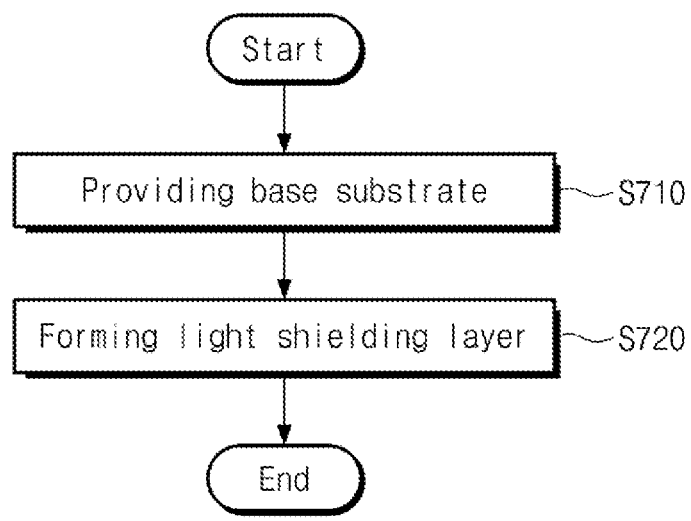
FIG. 7A is a flowchart representing a method for manufacturing a window member according to an exemplary embodiment of the inventive concepts.
Figure 7B:
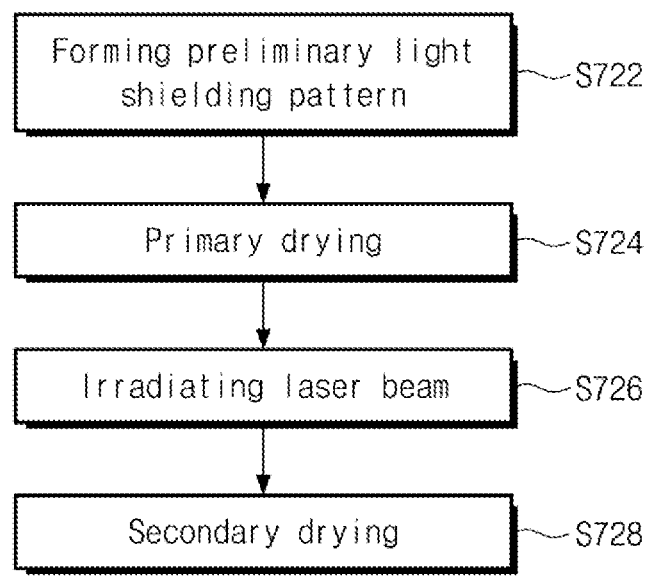
FIG. 7B is a flowchart representing a process of forming a light shielding layer of FIG. 7A.
Figure 8A:
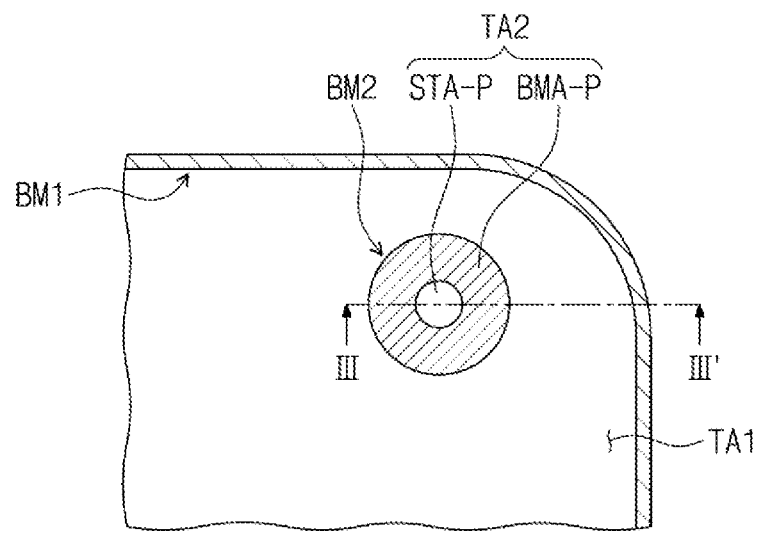
FIG. 8A is a plan view illustrating one process of a method for manufacturing a window member according to an exemplary embodiment of the inventive concepts.
Figure 8B:
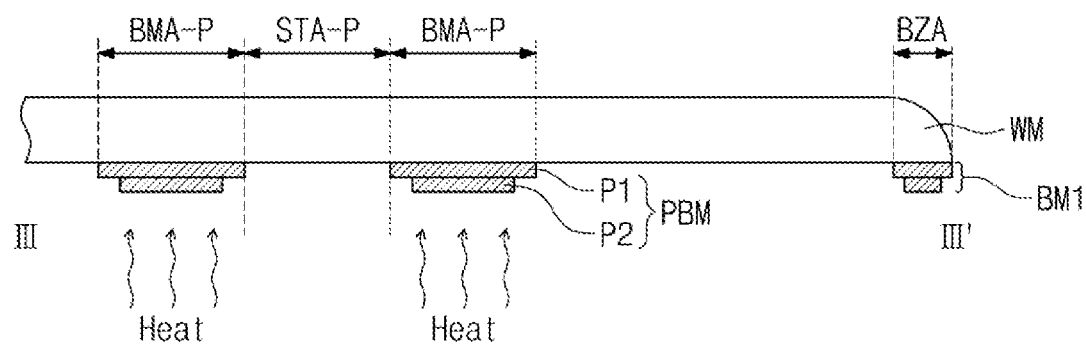
FIG. 8B is a cross-sectional view illustrating one process of a method for manufacturing a window member according to an exemplary embodiment of the inventive concepts.
Figure 8C:
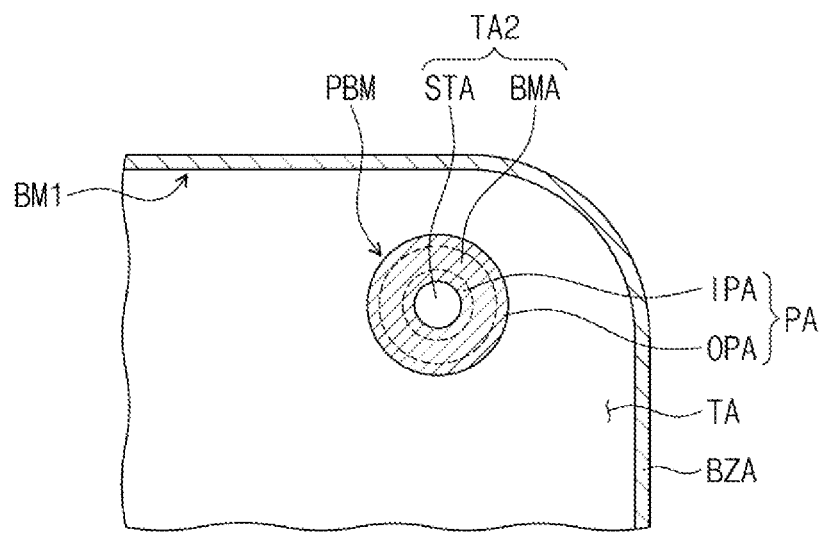
FIG. 8C is a plan view illustrating one process of a method for manufacturing a window member according to an exemplary embodiment of the inventive concepts.
Figure 8D:
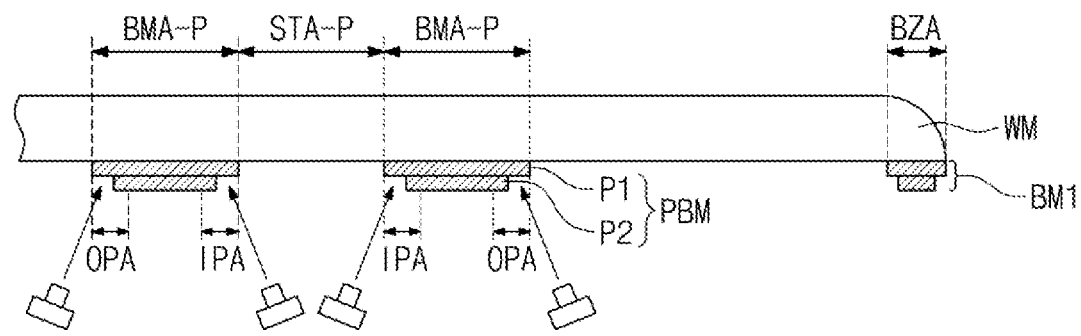
FIG. 8D is a cross-sectional view illustrating one process of a method for manufacturing a window member according to an exemplary embodiment of the inventive concepts.
Figure 8E:
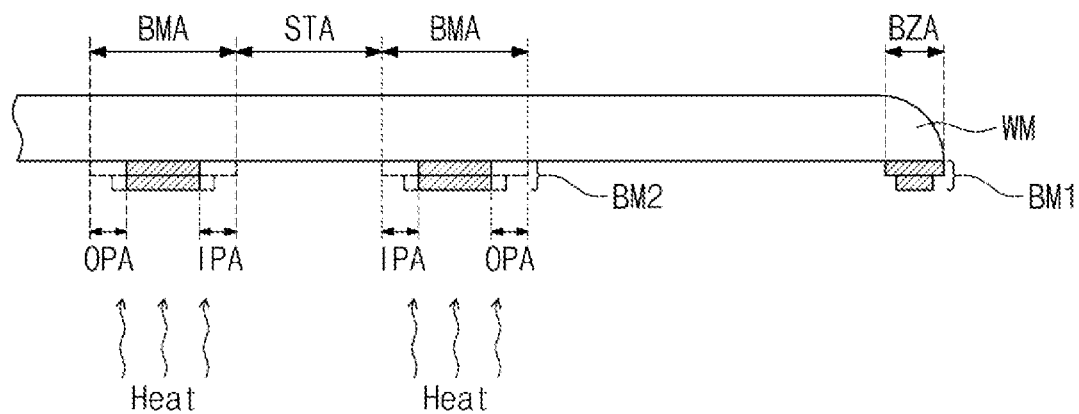
FIG. 8E is a cross-sectional view illustrating one process of a method for manufacturing a window member according to an exemplary embodiment of the inventive concepts.
Figure 8F:
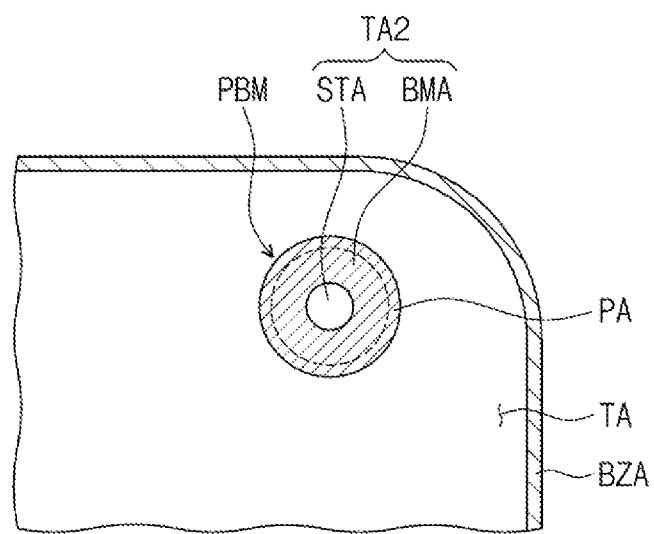
FIG. 8F is a plan view illustrating one process of a method for manufacturing a window member according to an exemplary embodiment of the inventive concepts.

FIG. 7A is a flowchart representing a method for manufacturing a window member according to an exemplary embodiment of the inventive concepts. FIG. 7B is a flowchart representing a process of forming a light shielding layer of FIG. 7A. FIG. 8A is a plan view illustrating one process of the method for manufacturing the window member according to an exemplary embodiment of the inventive concepts. FIG. 8B is a cross-sectional view of the window member taken along line of FIG. 8A. FIG. 8C is a plan view illustrating one process of method for manufacturing the window member according to an exemplary embodiment of the inventive concepts. FIG. 8D is a cross-sectional view illustrating one process of the method for manufacturing the window member according to an exemplary embodiment of the inventive concepts. FIG. 8E is a cross-sectional view illustrating one process of the method for manufacturing the window member according to an exemplary embodiment of the inventive concepts. FIG. 8F is a plan view illustrating one process of the method for manufacturing the window member according to an exemplary embodiment of the inventive concepts.

As illustrated in FIGS. 7A and 7B, the method for manufacturing the window member according to an exemplary embodiment of the inventive concepts includes a process S710 of providing a base substrate and a process S720 of forming a light shielding layer on the base substrate. The process S720 of forming the light shielding layer BML includes a process S722 of forming a preliminary light shielding pattern PBM, a process S724 of primarily drying the preliminary light shielding pattern PBM, a process S726 of irradiating the dried preliminary light shielding pattern PBM with a laser beam LSR, and a process S728 of secondarily drying the preliminary light shielding pattern PBM irradiated with the laser beam LSR.

Although the process S724 of primarily drying and the process S728 of secondarily drying are described separated processes of drying using a heat source in the embodiment, embodiments of the inventive concepts are not limited thereto. For example, the drying process may be omitted in an embodiment of the inventive concepts. For example, the preliminary light shielding pattern PBM and the light shielding pattern irradiated with the laser beam LSR may be dried by a natural drying method.

A partial area PA of the preliminary light shielding pattern PBM may be removed by performing the above-described process of irradiating the laser beam LSR. An area irradiated with the laser beam LSR corresponds to an area to be removed.

The process S722 of forming the preliminary light shielding pattern PBM and the process S724 of primarily drying will be described in detail with reference to FIGS. 8A and 8B. The preliminary light shielding pattern PBM includes a first layer P1 and a second layer P2, which have a stepped portion. The process S722 of forming the preliminary light shielding pattern PBM includes a process of forming a preliminary light shielding pattern PBM on one surface of the base substrate WM and a process of patterning the preliminary light shielding pattern PBM. In FIGS. 8A and 8B, the one surface of the base substrate WM is a bottom surface of the base substrate WM.

In more detail, the first layer P1 is formed by forming the preliminary light shielding pattern PBM on the entire one surface of the base substrate WM and then performing a primary patterning. Thereafter, the second layer P2 is formed by forming the preliminary light shielding pattern PBM on the entire one surface of the base substrate WM and then performing a secondary patterning. Since the secondary patterning is performed, the first layer P1 and the second layer P2 have a stepped portion.

The preliminary light shielding pattern PBM defines a preliminary light shielding pattern area BMA-P and provides a preliminary signal transmission area STA-P at an inner side thereof.

The preliminary light shielding pattern PBM is formed and then the preliminary light shielding pattern PBM is primarily dried in the operation S724. For example, the preliminary light shielding pattern PBM may be dried through a drying method using hot air or a Infrared Ray (IR) drying method.

Although the first light shielding pattern BM1 of the light shielding layer BML is formed through the same method as the preliminary light shielding pattern PBM in the embodiment, embodiments of the inventive concepts are not limited thereto.

The process S726 of irradiating a laser beam LSR will be described in detail with reference to FIGS. 8C and 8D.

The second light shielding pattern BM2 may be formed by irradiating the partial area PA of the preliminary light shielding pattern PBM with the laser beam LSR to remove the partial area PA. Here, the partial area PA may correspond to at least one of an inner edge area IPA and an outer edge area OPA of the preliminary light shielding pattern PBM. Although all of both sides are removed in the embodiment, embodiments of the inventive concepts are not limited thereto.

The light shielding pattern area BMA of the second light shielding pattern BM2 may be formed by removing the partial area PA from the preliminary light shielding pattern PBM and thus have a size less than preliminary light shielding pattern area BMA-P of the preliminary light shielding pattern PBM. Thus, in an embodiment of the inventive concepts, the light shielding pattern area BMA of the second light shielding pattern BM2, which surrounds the signal transmission area STA, may be reduced in size (or width). In an embodiment of the inventive concepts, the method for irradiating the laser beam LSR may reduce a dimensional tolerance generated when the size of the light shielding pattern area BMA is reduced. Also, in an embodiment of the inventive concepts, as the dimensional tolerance is reduced, the dead space may be restricted from generating around the signal transmission area STA.

In an embodiment, the process S726 of irradiating the laser beam LSR may reduce the dimensional tolerance in a range from about 0.08 mm to about 0.04 mm. The laser beam LSR having a small spot size may be used for dimensional accuracy, and, to this end, a wavelength of about 532 nm or about 355 nm may be used. For example, when a wavelength of about 532 nm is used, a spot size of about 20 μm to about 30 μm may be used, and when a wavelength of about 355 nm is used, a spot size of about 5 μm to about 15 μm may be used. When a wavelength of about 355 nm is used, a spot size and a depth of focus (DOF) may be narrowed, and thus advantageous in precision processing.

As illustrated in FIG. 8E, the preliminary light shielding pattern PBM irradiated with the laser beam LSR is secondarily dried in the process S728. Although the secondary drying process may use the same drying method as the primary drying method, embodiments of the inventive concepts are not limited thereto.

In FIG. 8E, the process of irradiating the partial area PA of the preliminary light shielding pattern PBM with the laser beam LSR may align side surfaces of the first layer P1 and the second layer P2 on a cross-section by removing the inner edge area IPA and the outer edge area OPA of the preliminary light shielding pattern PBM. Also, the signal transmission area STA may have an area greater than preliminary signal transmission area STA-P by removing the inner edge area IPA.

Referring to FIG. 8F, an example of irradiating only one area of the inner edge area IPA and the outer edge area OPA with the laser beam LSR is illustrated. Although an embodiment of removing the outer edge area OPA is illustrated in FIG. 8F, embodiments of the inventive concepts are not limited thereto. Except the above-described feature, the manufacturing method may be the same as that described in FIGS. 8A to 8E.

Figure 9A:
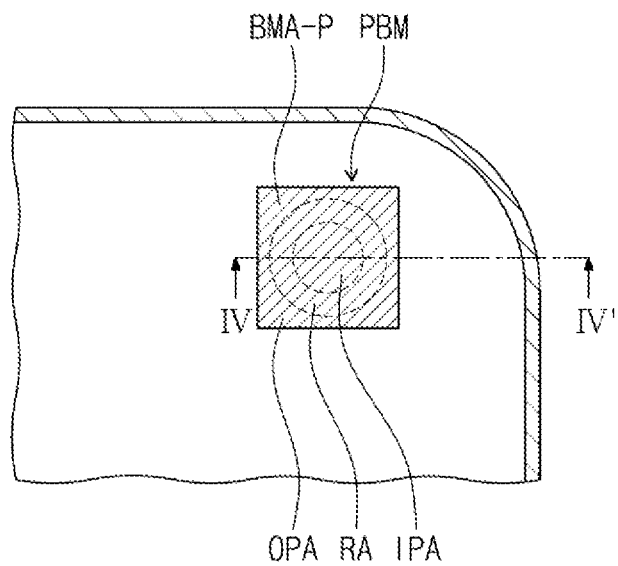
FIG. 9A is a plan view illustrating one process of a method for manufacturing a window member according to an exemplary embodiment of the inventive concepts.
Figure 9B:
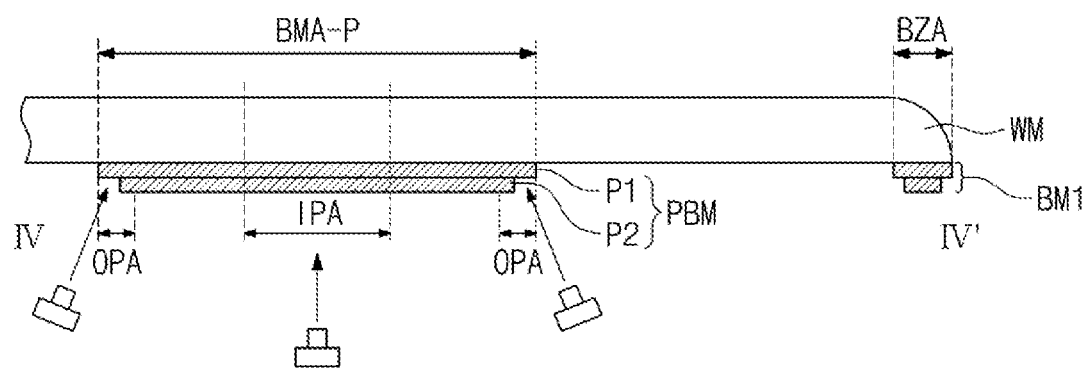
FIG. 9B is a cross-sectional view illustrating one process of a method for manufacturing a window member according to an exemplary embodiment of the inventive is concepts.

FIG. 9A is a partial plan view illustrating a preliminary light shielding pattern of a window member according to another exemplary embodiment of the inventive concepts. FIG. 9B is a cross-sectional view taken long line IV-IV' of FIG. 9A. In FIGS. 9A and 9B, a shape of the preliminary light shielding pattern PBM may be variously changed. For example, the preliminary light shielding pattern PBM having a rectangular or circular shape may define only the preliminary light shielding pattern area BMA-P without providing the preliminary signal transmission area STA-P. The preliminary light shielding pattern PBM may have a variable size. However, in consideration of a defect, the preliminary light shielding pattern PBM may have a narrow size.

In FIG. 9B, the signal transmission area STA, the inner edge EZ1, and the outer edge EZ2 may be defined by removing the partial area PA of the preliminary light shielding pattern PBM through irradiation of the laser beam LSR. The partial area PA includes an outer edge area OPA and an inner edge area IPA. The second light shielding pattern area RA corresponds to the second light shielding pattern BM2 formed by removing the partial area PA. The second light shielding pattern area RA may be variably determined according to an irradiation method of the laser beam LSR of a user.

FIGS. 8A to 9B explain an exemplary embodiment of irradiating the partial area PA of the preliminary light shielding pattern PBM with the laser beam LSR from a bottom surface of the base substrate WM, i.e., from below the bottom surface. However, an irradiation direction of the laser beam LSR may be varied.

Figure 10:
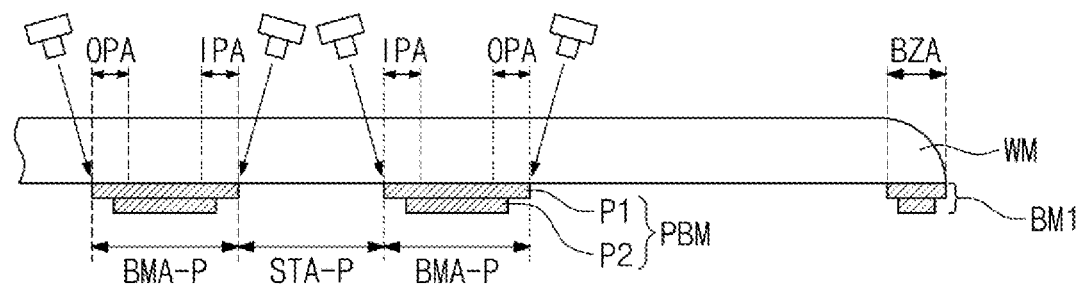
FIG. 10 is a cross-sectional view illustrating one process of a method for manufacturing a window member according to an exemplary embodiment of the inventive concepts.

Referring to FIG. 10, in an exemplary embodiment of the inventive concepts, the laser beam LSR may be irradiated to the partial area PA of the preliminary light shielding pattern PBM from a top surface of the base substrate WM, i.e., from above the top surface. For example, when the laser beam LSR has a wavelength range from about 350 nm to about 1500 nm, the laser beam LSR may transmit through the base substrate WM that is a glass substrate. That is, the inner edge area IPA and the outer edge area OPA of the preliminary light shielding pattern PBM may be removed by irradiating the laser beam LSR from above the top surface of the base substrate WM.

The window member according to an exemplary embodiment of the inventive concepts, an electronic apparatus including the same, and the manufacturing method of the window member may form the light shielding layer corresponding to the light shielding pattern area around the signal transmission area provided in the transmission area of the window member and reduce the area of the light shielding pattern area by removing a portion of the light shielding pattern.

The window member according to an exemplary embodiment of the inventive concepts, an electronic apparatus including the same, and the manufacturing method of the window member may reduce the area of the light shielding pattern area through the patterning of forming the preliminary light shielding pattern and removing the partial area by irradiating the laser beam.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A window member comprising:
   a base substrate; and
   a light shielding layer comprising a first light shielding pattern disposed in a first area of the base substrate and a second light shielding pattern disposed in a second area of the base substrate while being spaced apart from the first light shielding pattern and providing a signal transmission area at an inner side thereof,
   wherein the second light shielding pattern comprises an edge having a plurality of curved portions on a plane.

2. The window member of claim 1, wherein the second light shielding pattern has a multilayer structure.

3. The window member of claim 1, wherein the second light shielding pattern comprises a first layer disposed on the base substrate and a second layer disposed on the first layer, and a side surface of the first layer and a side surface of the second layer are aligned on a cross-section.

4. The window member of claim 1, wherein the edge comprises an outer edge and an inner edge configured to define the signal transmission area, and the inner edge is a closed line.

5. The window member of claim 4, wherein at least one of the outer edge and the inner edge comprises the plurality of curved portions.

6. The window member of claim 4, wherein a distance between the outer edge and the inner edge is about 0.05 mm to about 1.50 mm.

7. The window member of claim 1, wherein the signal transmission area is provided in plurality.

8. The window member of claim 1, wherein the base substrate is a glass substrate, and the second light shielding pattern is directly disposed on one surface of the glass substrate.

9. The window member of claim 1, wherein the first light shielding pattern and the second light shielding pattern have a same laminated structure.

10. The window member of claim 1, wherein each of the curved portions comprises a curved line recessed toward the inside of the second light shielding pattern on the plane.

11. The window member of claim 1, wherein a pitch of the curved portions is about 5 μm to about 30 μm.

12. The window member of claim 1, wherein the second light shielding pattern comprises a first layer having a black color and a second layer having a non-black color.

13. An electronic apparatus comprising:
a display panel comprising a display area configured to display an image and a non-display area disposed adjacent to the display area;
a window member disposed on the display panel; and
an input sensor disposed between the display panel and the window member,
wherein:
the window member comprises a base substrate and light shielding patterns disposed on a bottom surface of the base substrate;
the light shielding patterns comprise a first light shielding pattern disposed in a first area of the base substrate and a second light shielding pattern disposed in a second area of the base substrate while being spaced apart from the first light shielding pattern; and
the second light shielding pattern comprises an edge having a plurality of curved portions on the plane, the second light shielding pattern being surrounded by the display area on a plane and providing a signal transmission area at an inner side.

14. The electronic apparatus of claim 13, further comprising an electronic module disposed below the window member and the display panel and aligned with the signal transmission area.

15. The electronic apparatus of claim 14, wherein the electronic module comprises a camera module, an infrared sensor, or a photo sensor.

16. The electronic apparatus of claim 13, wherein at least one of the display panel and the input sensor comprises a first area corresponding to the signal transmission area and a second area adjacent to the first area, and the first area has a light transmittance greater than the second area.

* * * * *